(12) United States Patent
Song et al.

(10) Patent No.: US 9,282,667 B2
(45) Date of Patent: Mar. 8, 2016

(54) DISPLAY APPARATUS

(71) Applicant: LG Electronics Inc., Seoul (KR)

(72) Inventors: Hyeoncheol Song, Seoul (KR); Ahreum Lee, Seoul (KR); Jinsu Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 89 days.

(21) Appl. No.: 14/011,000

(22) Filed: Aug. 27, 2013

(65) Prior Publication Data

US 2014/0268584 A1   Sep. 18, 2014

(30) Foreign Application Priority Data

Mar. 18, 2013  (KR) .................. 10-2013-0028681
May 2, 2013    (KR) .................. 10-2013-0049283

(51) Int. Cl.
| | |
|---|---|
| H05K 7/00 | (2006.01) |
| H05K 5/00 | (2006.01) |
| H05K 7/02 | (2006.01) |
| G02F 1/1333 | (2006.01) |
| G06F 1/16 | (2006.01) |
| H04N 5/645 | (2006.01) |
| H01L 51/00 | (2006.01) |
| H04M 1/02 | (2006.01) |

(52) U.S. Cl.
CPC ............ H05K 7/02 (2013.01); G02F 1/133305 (2013.01); G02F 1/133308 (2013.01); G06F 1/1652 (2013.01); H04N 5/645 (2013.01); *H01L 51/0097* (2013.01); *H01L 2251/5338* (2013.01); *H04M 1/0268* (2013.01); *Y02E 10/549* (2013.01)

(58) Field of Classification Search
CPC ............ H05K 5/03; G09F 9/301; G09F 13/04
USPC ............... 361/679.01–679.09, 679.1–679.19, 361/679.21–679.29, 679.31–679.45, 361/679.55–679.6, 724–747; 248/917–924, 248/80–88, 155.1–155.5, 166–173, 248/180.1–186.2, 229.1–231.51, 271.4, 248/292.14, 316.1–316.8
See application file for complete search history.

(56) References Cited

U.S. PATENT DOCUMENTS

2013/0155655 A1*  6/2013  Lee et al. ................... 362/97.1

FOREIGN PATENT DOCUMENTS

| JP | 10-026754 A | 1/1998 |
|---|---|---|
| JP | 2006-023676 | 1/2006 |

* cited by examiner

Primary Examiner — Jerry Wu
(74) Attorney, Agent, or Firm — Dentons US LLP

(57) ABSTRACT

A display apparatus includes a display module for displaying an image, and a variable member for varying a shape of the display module. The variable member includes a first portion capable of varying in shape, and a second portion having opposite ends respectively fixed to opposite ends of the first portion, where a distance between the opposite ends of the second portion is varied such that the opposite ends of the first portion protrudes with respect to a central region of the first portion and thereby, the display module is varied in shape.

20 Claims, 7 Drawing Sheets

DISPLAY APPARATUS

CROSS-REFERENCE TO RELATED APPLICATION

This application claims the priority benefit of Korean Patent Application No. 10-2013-0028681 filed on Mar. 18, 2013 and Korean Patent Application No. 10-2013-0049283 filed on May 2, 2013 in the Korean Intellectual Property Office, the disclosure of which is incorporated herein by reference.

BACKGROUND

1. Field of the Disclosure

The present disclosure relates to a display apparatus, and more particularly to a display apparatus with an improved structure.

2. Description of the Related Art

Various types of display apparatuses are used to display images. For example, there are various displays such as a liquid crystal display panel, a plasma display panel, and an organic light emitting diode display panel.

In accordance with recent expansion of application fields of display apparatuses, diverse characteristics of display apparatuses are now required in the application fields. In particular, such requirements have been increased in association with characteristics related not only to simple display of images, but also to display of images taking into consideration three-dimensional effects and sensory immersion. In order to meet such various requirements, research is being conducted to provide various display apparatuses having improved structures.

SUMMARY

Therefore, in view of the above problems, one object is to provide a display apparatus having an improved structure capable of achieving an enhancement in sensory immersion of a user.

In accordance with one aspect, the above and other objects can be accomplished by the provision of a display apparatus including a display module for displaying an image, and a variable member for varying a shape of the display module, wherein the variable member includes a first portion capable of varying in shape, and a second portion having opposite ends respectively fixed to opposite ends of the first portion, where a distance between the opposite ends of the second portion is varied such that the opposite ends of the first portion protrudes with respect to a central region of the first portion and thereby, the display module is varied in shape.

BRIEF DESCRIPTION OF THE DRAWINGS

The above and other objects, features and other advantages will be more clearly understood from the following detailed description taken in conjunction with the accompanying drawings, in which.

DETAILED DESCRIPTION OF THE PREFERRED EMBODIMENTS

Figure 1:
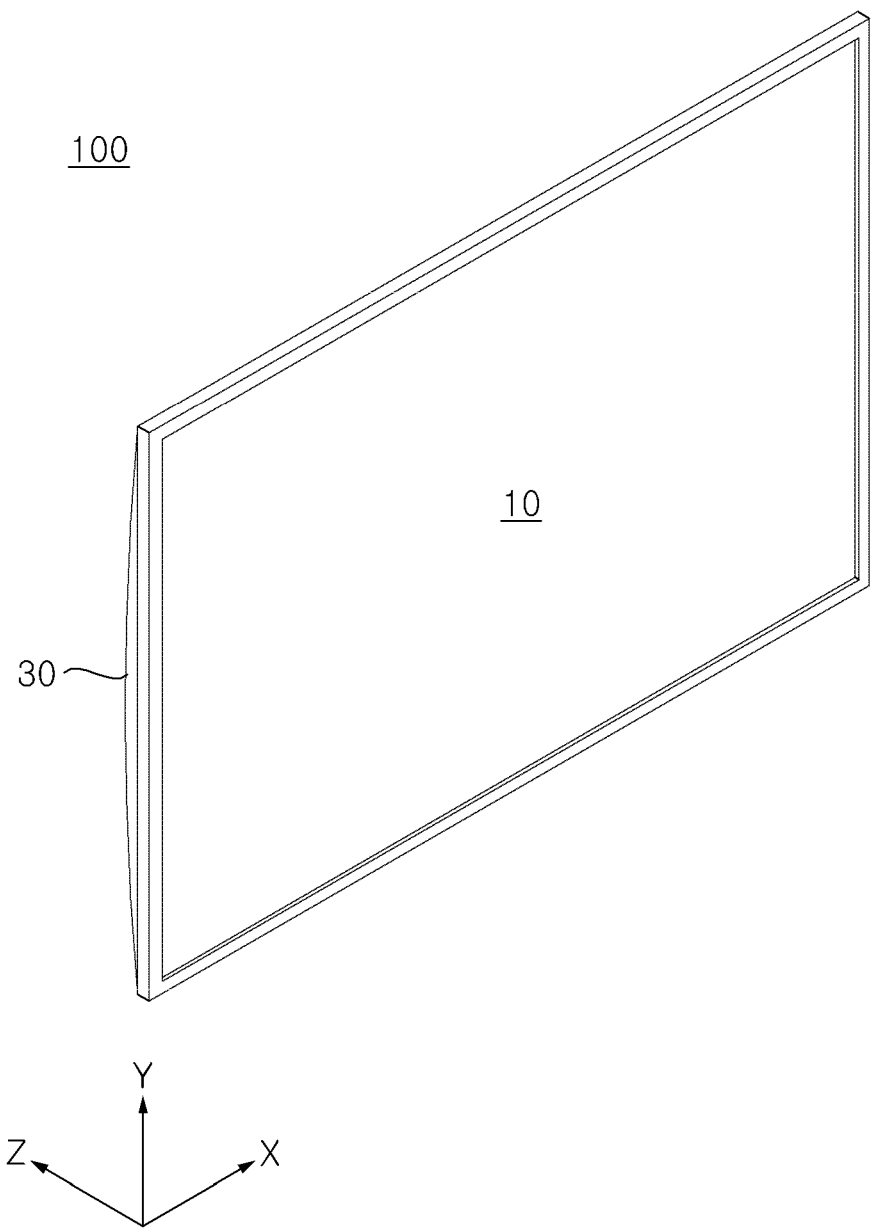
FIG. 1 is a front perspective view of a display apparatus according to an exemplary embodiment of the present invention.

Reference will now be made in detail to preferred embodiments of the present invention, examples of which are illustrated in the accompanying drawings. These embodiments are not intended to limit the present invention. Other embodiments may also be provided.

Constituent elements other than elements constituting essential features of the present invention may be omitted from the drawings, for clarity of description. Like reference numerals refer to like elements throughout. In the drawings, the widths, thicknesses, etc. of constituent elements may be exaggerated or reduced for clarity and convenience of illustration. The present invention is not limited to the illustrated thicknesses, widths, and etc.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, in the description of the embodiments, it will be understood that when a layer (or film), a region, a pad, a pattern or a structure is referred to as being disposed 'on/above/over' another layer, region, pad, pattern or structure, it can be directly in contact with another layer, region, pad, pattern or structure, or one or more intervening layers, regions, pads, patterns or structures may also be present. In addition, it will also be understood that when a layer (or film), a region, a pad, a pattern or a structure are referred to as being disposed 'between' two layers, two regions, two pads, two patterns or two structures, it can be the only layer, region, pad, pattern or structure between the two layers, the two regions, the two pads, the two patterns and the two structures or one or more intervening layers, regions, pads, patterns or structures may also be present.

Figure 2:
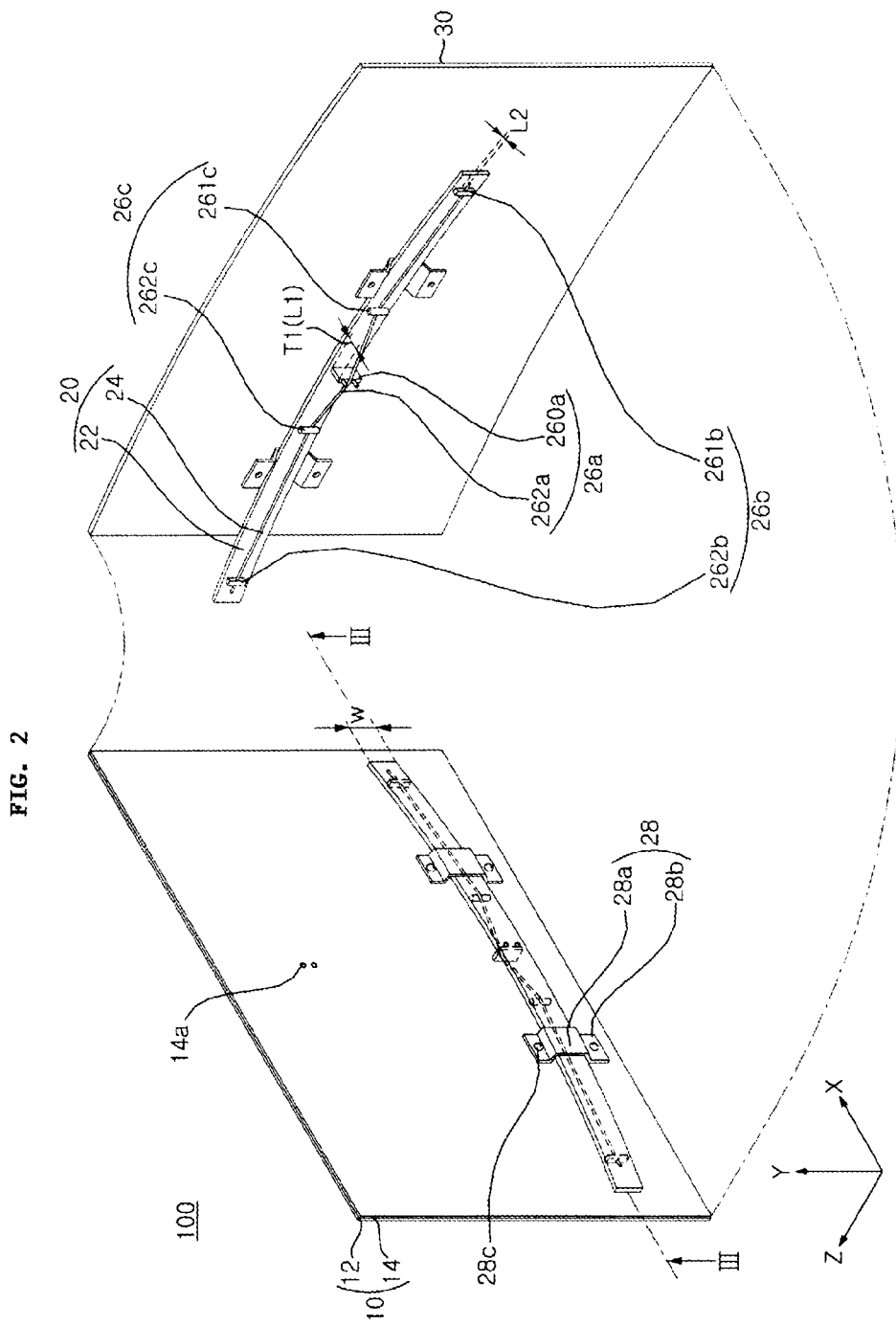
FIG. 2 is an exploded rear perspective view of the display apparatus according to an exemplary embodiment of the present invention.
Figure 3:
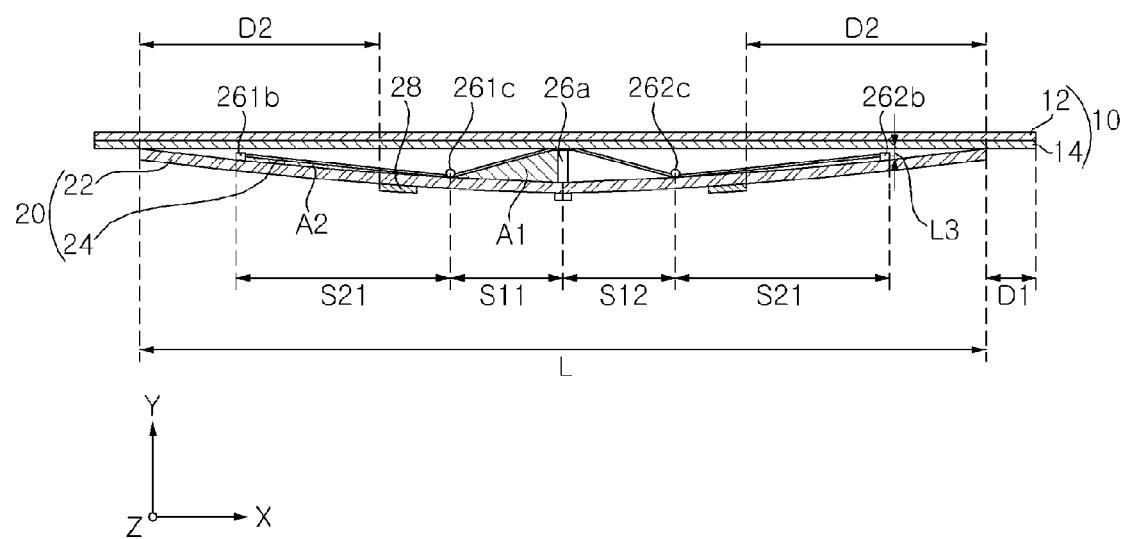
FIG. 3 is a cross-sectional view of the display apparatus taken along line III-III of FIG. 2.

FIG. 1 is a front perspective view of a display apparatus according to an exemplary embodiment of the present invention. FIG. 2 is an exploded rear perspective view of the display apparatus according to an exemplary embodiment of the present invention. FIG. 3 is a cross-sectional view of the display apparatus taken along line III-III of FIG. 2.

Referring to FIGS. 1 and 2, the display apparatus of the illustrated embodiment, which is designated by reference numeral "100", includes a display module 10 for displaying an image, and a variable member 20 for varying the shape of the display module 10. The display apparatus 100 also includes a rear cover 30 for covering a rear surface of the display module 10. This will be described in more detail.

The display apparatus 100 is an apparatus for displaying data, images or the like on a screen, to be visible. The display apparatus 100 may include various kinds of articles such as televisions, computer monitors, mobile phones, and e-books.

The display module 10 may include a display panel 12 for displaying an image, a support member 14 disposed at a rear surface of the display panel 12, to support the display panel 12, and a panel driver (not shown) fixed to the support member 14, to provide signals for driving of the display panel 12. Although not shown, the display module 10 may further include frames for enclosing edges of the display panel 12 and support member 14.

In an exemplary embodiment, the display panel 12 may be a panel not only having various structures and types capable of displaying an image, but also having flexibility, to be varied in shape by the variable member 20.

For example, the display panel 12 may be an organic light emitting display panel using organic light emitting diodes (OLEDs). Such an organic light emitting display panel is a self-luminous display panel in which electrons and holes are combined in a fluorescent or phosphorescent organic thin film when current flows through the organic thin film, thereby generating light. The organic light emitting display panel has various advantages such as excellent picture quality capable of providing bright and crisp images, no restriction as to viewing angle, and low power consumption. In particular, the organic light emitting display panel exhibits excellent flexibility in that it can be manufactured through lamination of organic thin films. Of course, the present invention is not limited to such a display panel. For the display panel 12, various display panels having various structures and types may be employed.

The support member 14, which is disposed at the rear surface of the display panel 12, supports the display panel 12. The panel driver and variable member 20 may be fixed to a rear surface of the support member 14. As described above, the panel driver drives the display panel 12. To this end, the support member 14 not only has strength to firmly support the display panel 12, panel driver, and variable member 20, but also has flexibility and elasticity to be varied in shape in accordance with variation in the shape of the display panel 12. In order to avoid thermal stress, the support member 14 may have a coefficient of thermal expansion similar to that of the display panel 12.

For example, in an exemplary embodiment, the support member 14 may include a composite material such as reinforced plastic. Here, the composite material is a material obtained by artificially combining two or more kinds of materials, to exhibit excellent characteristics. For example, the support member 14 may include carbon fiber reinforced plastic (CFRP), glass fiber reinforced plastic (GFRP) or the like. In this case, the support member 14 may exhibit not only characteristics of lightness and flexibility by virtue of the plastic, but also high strength, high elasticity and excellent wear resistance by virtue of the fiber type reinforcing material. The support member 14 may be constituted by a single composite material layer or may be constituted by a plurality composite material layers, to exhibit excellent strength.

The support member 14 may be fixed to the rear surface of the display panel 12 by an adhesive (for example, a double-sided tape). Of course, the present invention is not limited to such a fixing method. The display panel 12 and support member 14 may be fixed to each other, using various fixing methods.

The panel driver fixed to the rear surface of the support member 14 includes a circuit board (not shown) including various wirings and elements to provide signals for driving of the display panel 12. The panel driver may be fixed to the support member 14 by a bracket (not shown) or the like. For example, the bracket may be fixed to the support member 14 at a middle portion thereof in order to minimize force required to vary the shape of the display panel 12. Of course, the present invention is not limited to such a structure, and various alternatives may be employed. For example, the panel driver may be partially or completely disposed at the outside of the display module 10. In an exemplary embodiment, the panel driver may include wirings, elements, and etc., for driving of the variable member 20.

In addition, frames may be provided to protect the edges of the display panel 12 and support member 14. Such frames not only protect the display panel 12 and support member 14, but also support the rear cover 30. That is, the rear cover 30 may be fastened to the frames by fastening members (not shown). The frames may have various shapes, and various fastening structures and methods may be employed to fasten the rear cover to the frames and, as such, no detailed description thereof will be given.

The variable member 20 is disposed at the display module 10 (in this embodiment, the variable member 20 is disposed at the rear surface of the support member 14), to vary the shape of the display panel 12. The variable member 20 may include a first portion 22 fixed to the support member 14 of the display module 10, and a second portion 24 disposed between the support member 14 and the first portion 22. The second portion 24 is fixed, at opposite ends thereof, to opposite ends of the first portion 22, respectively. The variable member 20 may further include guide members 28 to support the first portion 22 at an inner side of the guide member 28. In this embodiment, it is possible to vary the shape of the display module 10 by varying the distance between the opposite ends of the second portion 24 fixed to the first portion 22 (hereinafter, referred to as a "connection length"). For instance, the connection length is a rectilinear length between opposite ends of the second portion 24. Hereinafter, the shapes of the first and second portions 22 and 24 will be described in more detail.

Figure 4:
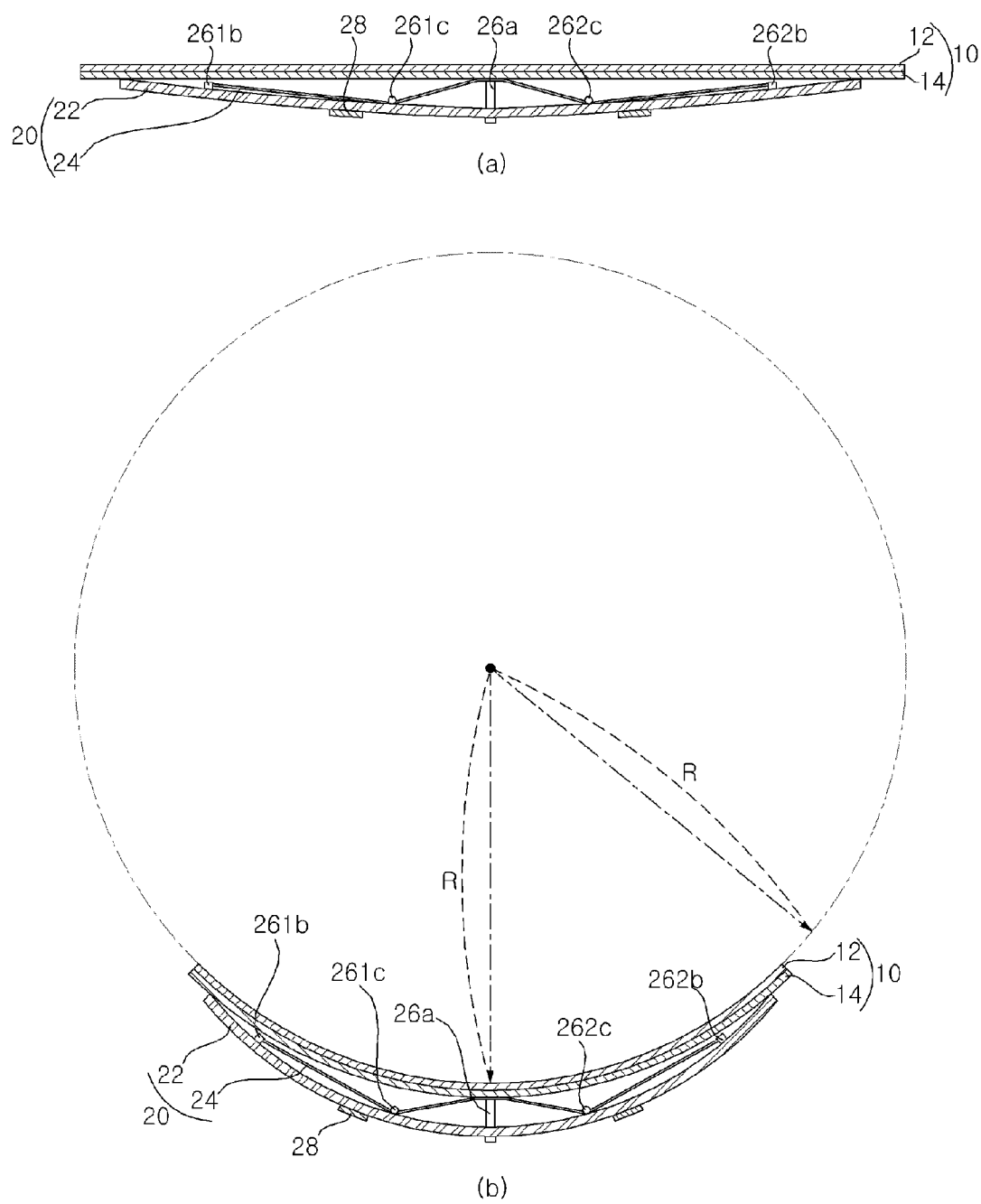
FIGS. 4(a) and 4(b) are views illustrating shape variation of the display apparatus according to an exemplary embodiment of the present invention.

In an exemplary embodiment, the variable member 20 may be elongated in one direction (for example, a lateral direction of the display apparatus 100). When the connection length of the second portion 24 is reduced, the first portion 22 is bent such that the opposite end regions thereof protrude forward with respect to the center region of the first portion 22. As a result, the display module 10 is varied into a curved structure having a predetermined radius of curvature (for example, "R" in FIG. 4(*b*)) in the lateral direction of the display module 10. In this state in FIG. 4(*b*), there is no difference in the distance from the eyes of the user to the display panel 12 between the middle and lateral end portions of the display panel 12. Even if there is a distance difference, such difference may be minute. Thus, it is possible to achieve an enhancement in sensory immersion of the user. Of course, the present invention is not limited to the above-described embodiment. For example, the varied shape of the variable member 20 may be different from the above-described shape and, as such, the varied shape of the display module 10 may also be different from the above-described shape.

In the illustrated embodiment, two variable members 20 are provided such that one variable member 20 is disposed at an upper portion of the display module 10, and the other variable member 20 is disposed at a lower portion of the display module 10. While two or more variable members 20 are preferred, a single variable member 20 may be disposed at an intermediate portion of the display module 10, although insufficient shape variation may occur at upper and lower edge portions of the display module 10. Taking into such consideration, in this embodiment, two variable members 20 are implemented. When a plurality of variable members 20 are provided, it is possible to achieve uniform shape variation throughout the entirety of the display module 10. Of course, the present invention is not limited to two variable members, and various alternatives may be employed. For example, only one variable member 20 is provided for cost reduction and structure simplification.

The second portion 24 may have a structure extending in the lateral direction of the display module 10 (for example, a wire structure). The connection length of the second portion 24 may be varied by diverse energy (for example, thermal energy, electrical energy, or mechanical energy).

For example, when the second portion 24 is made of a material variable in shape in accordance with a variation in temperature, it is possible to vary the temperature of the second portion 24, and thus the connection length of the second portion 24 by supplying thermal energy or electrical energy. In this case, the second portion 24 may be a shape memory alloy. A shape memory alloy is an alloy utilizing shape memory and super-plasticity properties exhibited in metals exhibiting austenite-martensite transformation. Such a shape memory alloy has different shapes at different temperatures. The second portion 24 may be connected to an element included in the panel driver, to drive the variable member 20, for temperature adjustment thereof. In accordance with temperature adjustment, the connection length of the second portion 24 may be varied. When the second portion 24 includes a shape memory alloy and, as such, the connection length of the second portion 24 is varied by thermal energy or electrical energy, it is possible to achieve a simple structure of the variable member, and thus easy application of the variable member. In addition, there is no noise generated during shape variation of the display module 10.

Alternatively, it may be possible to vary the connection length of the second portion 24 by mechanical energy supplied from a separate driver (not shown) (for example, a motor) to supply mechanical energy, together with the panel driver. In this case, a part of the second portion 24 is fixed to the motor and, as such, it is possible to vary the connection length of the second portion 24 by winding or unwinding a portion of the second portion 24 on or from a rotating shaft of the motor in accordance with rotation of the motor. In this case, the second portion 24 may be made of a material exhibiting little or no stretchability even under diverse conditions while having high yield strength. When the second portion 24 is stretchable, it is difficult to accurately vary the connection length of the second portion 24. In addition, it may be necessary to provide increased mechanical energy. For example, the second portion 24 may include a metal steel wire (for example, a stainless wire), an aramid fiber, a carbon steel wire or the like. Of course, the second portion 24 may be made of various other materials. The driver, which is a motor or the like to supply mechanical energy, may have various configurations capable of varying the shape of the variable member 20. When the driver, which is a motor or the like, varies the shape of the variable member 20, using mechanical energy, it is possible to easily vary the shape of the variable member 20 while accurately controlling the variation degree and variation time of the variable member 20.

The second portion 24 may have a diameter of 0.5 to 10 mm. When the diameter of the second portion 24 is less than 0.5 mm, there may be a problem in that the second portion 24 may snap or deform upon receiving energy from the driver. On the other hand, when the diameter of the second portion 224 exceeds 10 mm, there may be problems of increased costs and complicated configurations because mechanical energy required to vary the connection length of the second portion 24 should be increased. Of course, the present invention is not limited to the above-described embodiment, and the second portion 24 may have various diameters.

Although only one second portion 24 is provided in association with the first portion 22 in the illustrated embodiment, a plurality of second portions 24 may be provided. That is, various alternatives may be employed.

When the connection length of the second portion 24 varies, as described above, the shape of the first portion 22 is varied. When the shape of the first portion 22 varies, the first portion 22 applies force to the display module 10, thereby causing the shape of the display module 10 to be correspondingly varied. Thus, the first portion 22 is a portion which is varied in shape by force received from the second portion 24, thereby varying the shape of the display module 10. In this regard, the first portion 22 may include a material having flexibility and excellent strength. In addition, the material of the first portion 22 may be lightweight in order to reduce the weight of the display apparatus 100.

For example, the first portion 22 may include a single layer structure or a multilayer structure, which includes a composite material, for example, reinforced plastic (CFRP, GFRP or the like). Of course, the present invention is not limited to such materials, and the first portion 22 may be made of various materials. The first portion 22 may have an elongated band shape having a certain width W. Accordingly, it is possible to more effectively apply force to the display module 10. Of course, the present invention is not limited to such a shape, and the first portion 22 may have various shapes.

The first portion 22 is fixed, at a central region thereof, to the display module 10 (in this embodiment, the support member 14) such that it cannot move at the central region. In this case, the first portion 22 is movable (in this case, forward and rearward) at opposite end regions thereof. Since the first portion 22 is movable at the opposite end regions thereof while being fixed at the central region thereof, the shape of the first portion 22 is variable.

The first portion 22 is fixed at the central region thereof by a central fixing member 26a such that it cannot move. The distance between the central region of the first portion 22 and the central region of the support member 14, namely, a first distance L1, may be greater than the distance between each end region of the first portion 22 and the corresponding end region of the support member 14, namely, a second distance L2. For example, the first portion 22 may be bent such that the central region of the first portion 22 is further protruded rearward from of the display module 10, as compared to other regions of the first portion 22 and, as such, the first portion 22 has a curved structure. Then, as an example in accordance with FIG. 4(*b*), when the display module 10 is varied in shape to have a predetermined radius of curvature R throughout the entirety thereof in accordance with variation in the connection length of the second portion 24, shape variation of the display module 10 may be more easily achieved.

The central fixing member 26a includes a bracket 260a for spacing the first and second portions 22 and 24 from each other while spacing the first portion 22 from the support member 14, and fastening members 262a for fastening the bracket 260a or first portion 22 to the support member 14.

The bracket 260a functions to space the first portion from the support member 14 such that the distance between the first portion 22 and the support member 14 is greater at the central region of the first portion 22 than at each end region of the first portion 22. Accordingly, the first portion 22 is maintained in a state of being further protruded from the rear surface of the display module 10. In addition, since the second portion 24 is disposed between the bracket 260a and the support member 14, the bracket 260a spaces the first and second portions 22 and 24 from each other such that the distance between the first and second portions 22 and 24 at the central region (namely, the first distance L1) is relatively great, as compared to distances at other regions. When the area between the first and second portions 22 and 24 increases, it is possible to easily achieve shape variation of the first portion 22 in accordance with a variation in the connection length of the second portion 24. In the illustrated embodiment, accordingly, it is possible to increase the area between the first and second portions 22 and 24 by spacing the first and second portions 22 and 24 from each other such that the distance between the first and second portions 22 and 24 at the central region (namely, the first distance L1) is relatively great, as compared to distances at other regions.

For example, the thickness of the bracket 260a, namely, a thickness T1 (the first length L1 between the first and second portions 22 and 24), may be 10 to 50 mm. When the thickness T1 of the bracket 260a exceeds 50 mm, the display apparatus 100 may be excessively thickened, and the first portion 22 may exhibit degraded structural stability. On the other hand, when the thickness T1 of the bracket 260a is less than 10 mm, much energy may be required to vary the shape of the first portion 22. Of course the present invention is not limited to the above-described conditions. The thickness T1 of the bracket 260a may be varied in accordance with the size of the panel, the radius of curvature R of the panel, and etc.

Each fastening member 262a may have various configurations and systems to fasten the first portion 22 and support member 14 at the central region of the first portion 22. For example, a PEM nut 14a may be mounted to the support member 14, and the fastening member 262a may be fastened to the PEM nut 14a after extending through the first portion 22 and/or the bracket 260a. Accordingly, it is possible to easily and simply fix the first portion 22 to the support member 14. Of course, the present invention is not limited to the above-described structures, and various fixing methods and structures may be employed for fixing of the first portion 22 to the support member 14.

In the illustrated embodiment, as shown in FIG. 3, each end of the first portion 22 is spaced from the corresponding lateral end of the display module 10 by a predetermined distance D1. For example, the distance D1 between each end of the first portion 22 and the corresponding lateral end of the display module 10 may be 1 to 30 mm. When the distance D1 exceeds 30 mm, it may be difficult to uniformly apply force to the display module 10 evenly at the edges of the display module 10. On the other hand, when the distance D1 is less than 1 mm, the first portion 22 may be protruded outside of the display module 10 during shape variation thereof. When another element is disposed on the shape variation path of the first portion 22, it may interfere with shape variation of the first portion 22. Of course, the present invention is not limited to the above-described conditions. The distance D1 may be varied in accordance with the size of the panel, the radius of curvature R of the panel, and etc.

The second portion 24 is fixed, at opposite ends thereof, to respective opposite ends of the first portion 22 and, as such, the distance between the opposite ends of the second portion 24 becomes the connection length of the second portion 24. The opposite ends of the second portion 24 may be fixed to respective opposite ends of the first portion 22 by an end fixing member 26b. The fixing member 26b may include a first end fixing member 261b for fixing one end of the second portion 24 to one end of the first portion 22, and a second end fixing member 262b for fixing the other end of the second portion 24 to the other end of the first portion 22.

The end fixing member 26b may fix the second portion 24 to the first portion 22 in various manners. For example, the end fixing member 26b may have a smaller thickness than the bracket 260a of the central fixing member 26a. The second portion 24 may extend through a portion of the end fixing member 26b and be embedded in the end fixing member 26b. Alternatively, it may be possible to fix each end of the second portion 24 to the corresponding end of the first portion 22 by forming a hole at the end of the first portion 22, extending the end of the second portion 24 through the hole, and then filling the hole with an adhesive or a seal. Of course, the present invention is not limited to the above-described method, and various other methods may be employed.

Accordingly, the spacing between each end of the first portion 22 and the corresponding end of the second portion 24 may have a smaller distance than the first distance L1, namely, the second distance L2. As a result, the first portion 22 may be easily varied as the connection length of the second portion 24 is varied.

Each end of the second portion 24 fixed by the end fixing member 26b may be spaced from the display module 10 by a third distance L3 (the thickness of the end fixing member 26b). In accordance with this spacing, it is possible to prevent the end of the second portion 24 from interfering with the display module 10. In particular, the spacing between the second portion 24 and the display module 10 is reduced when the shape of the display module 10 is varied in accordance with a variation in the connection length of the second portion 24. The third distance L3 is determined, taking into consideration such spacing reduction. For example, the third distance L3 may be 1 to 10 mm. When the third distance L3 exceeds 10 mm, the display apparatus 100 may be undesirably thickened. On the other hand, when the third distance L3 is less than 1 mm, the end of the second portion 24 may interfere with the display module 10. Of course, the present invention is not limited to the above-described conditions. Various alternatives may be employed.

An interference-preventing fixing member 26c may be disposed in a region between the central fixing member 26a and each end fixing member 26b, to fix the second portion 24 to the first portion 22 in that region and thereby, preventing the second portion 24 from interfering with the display module 10. The interference-preventing fixing member 26c may include a first interference-preventing fixing member 261c disposed between the central fixing member 26a and the first end fixing member 261b, and a second interference-preventing fixing member 262c disposed between the central fixing member 26a and the second end fixing member 262b.

The distance between the first and second portions 22 and 24 may be gradually reduced in a direction from the central fixing member 26a to the interference-preventing fixing member 26c by the interference-preventing fixing member 26c. Accordingly, the distance between the second portion 24 and the display module 10 may gradually increase in a direction from the central fixing member 26a to the first interference-preventing fixing member 261c, and then may gradually decrease in a direction from the first interference-preventing fixing member 261c to the end fixing member 261b. Similarly, the distance between the second portion 24 and the display module 10 may gradually increase in a direction from the central fixing member 26a to the second interference-preventing fixing member 262c, and then may gradually decrease in a direction from the second interference-preventing fixing member 262c to the end fixing member 262b.

In this case, districts, which constitute a central region of the second portion 24, which are gradually spaced away from the rear surface of the display module 10 as they extend toward corresponding ends of the second portion 24, may be referred to as "central districts S11 and S12". On the other hand, districts, which are disposed outside the central districts S11 and S12 gradually approach the rear surface of the display module 10 as they extend toward the corresponding ends of the second portion 24, may be referred to as "outer districts S21 and S22.

In this case, the central districts S11 and S12 may include a first central district S11 defined between the central fixing member 26a and the first interference-preventing fixing member 261c, and a second central district S12 defined between the central fixing member 26a and the second interference-preventing fixing member 262c. The first central district S11 and second central district S12 may have structures symmetrical with respect to the central region where the central fixing member 26a is disposed, respectively. In accordance with such structures, values of force at opposite sides of the central region may be equal and, as such, it is possible to prevent the display module 10 from being distorted.

Similarly, the outer districts S21 and S22 may include a first outer district S21 defined between the first interference-preventing fixing member 261c and the first end fixing member 261b, and a second outer district S22 defined between the second interference-preventing fixing member 262c and the second end fixing member 262b. The first outer district S21 and second outer district S22 may have structures symmetrical with respect to the central region where the central fixing member 26a is disposed, respectively. In accordance with such structures, values of force at opposite sides of the central region may be equal and, as such, it is possible to prevent the display module 10 from being distorted.

In accordance with the above-described structures, the second portion 24 may have a shape similar to "W". In accordance with this shape, it is possible to prevent problems such as interference while maximizing the force applied to the first portion 22.

The ratio of the first central district S11 (or the second central district S12) to the total length L of the first portion 22 may be 0.1 to 0.2. When the length ratio is less than 0.1, force applied to the first portion 22, which is proportional to the area between the first and second portions 22 and 24, may be insufficient. On the other hand, when the length ratio exceeds 0.2, the second portion 24 may interfere with the display module 10. Of course, the present invention is not limited to the above-described conditions, and the length ratio is variable.

Since the distance between the second portion 24 and the display module 10 increases gradually in the central districts S11 and S12 due to the interference-preventing fixing member 26c, as described above, it is possible to prevent the second portion 24 from interfering with the display module 10. Accordingly, there is no interference with shape variation. In addition, it is possible to generate high force to the first portion 22 by optimizing the length ratio of the central districts S11 and S12.

When it is assumed that the area between the first and second portions 22 and 24 in each of the central districts S11 and S12 is a first area A1, and the area between the first and second portions 22 and 24 in each of the outer districts S21 and S22 is a second area A2, the ratio of the first area A1 to the second area A2 may be 16 to 400. This area ratio is determined such that the sum of the first and second areas A1 and A2, "A1+A2" has a maximum value under the condition that there is no interference between the display module 10 and the second portion 24, taking into consideration the fact in which force applied to the first portion 22 is proportional to the sum "A1+A2" of the first and second areas A1 and A2. Of course, the present invention is not limited to such conditions, and the area ratio may be varied in accordance with the area of the display module 10, the radius of curvature R of the display module 10, and etc.

The central fixing member 26a, end fixing member 26b, and interference-preventing fixing member 26c may be made of various materials. These members may be made of a material capable of achieving easy fixing while preventing the second portion 24 from being damaged. For example, the members may be made of a material such as resin (for example, polyphenyl amide). Of course, the present invention is not limited to such materials.

The first portion 22 may be movably held by the guide members 28 fixed to the support member 14. Accordingly, it is possible to movably hold the first portion 22 while preventing the first portion 22 from being downwardly bent.

Each guide member 28 includes an upper portion 28a spaced from the support member 14, to form a predetermined space therebetween, and side portions 28b bent from the upper portion 28a, to be disposed adjacent to the support member 14. The side portions 28b are fixed to the support member 14 by fastening members 28c. For example, fixing of each guide member 28 to the support member 14 may be achieved by mounting PEM nuts (not shown) to the support member 14, and fastening the fastening members 28c, which may be screws or the like, to the PEM nuts through fastening holes formed at the side portions 28b. Using the PEM nuts and screws as described above, it is possible to easily and simply achieve fastening. Of course, the present invention is not limited to the above-described structures, and various fixing methods and structures may be employed for fixing of the side portions 28b to the support member 14.

Since the distance between the first portion 22 and the display module 10 increases gradually toward the central region, the guide member 28 may be formed correspondingly, such that each side portion 28b thereof has a height increasing gradually toward the central region. In this case, the first portion 22 may be freely laterally movable while being effectively supported by the guide members 28.

The ratio of the distance D2, by which each guide member 28 is spaced from the corresponding end of the first portion 22, to the total length L of the first portion 22, D2/L, may be 0.2 to 0.4. This distance ratio is determined to firmly hold the first portion 22 such that the first portion 22 is prevented from being downwardly bent at the opposite end regions thereof. Of course, the present invention is not limited to such conditions.

The rear cover 30 is disposed in rear of the display module 10 and variable member 20. The rear cover 30 protects the display module 10, panel driver, and etc., from external impact while providing a space where the panel driver, and etc., are disposed. The rear cover 30 also covers the panel driver, and etc., to prevent an inner configuration of the display module 10 from being outwardly exposed, and also to achieve an enhancement in appearance. For example, the rear cover 30 has a surface gently curved throughout the rear cover 30, to secure a sufficient space and to achieve an enhancement in appearance. In an exemplary embodiment, the rear cover 30 includes a material, a structure, or the like capable of coping with a variation in shape of the display module 10.

The above-described shape variation of the display apparatus 100 will be described in more detail with reference to FIGS. 4(a) and 4(b). FIGS. 4(a) and 4(b) are views explaining shape variation of the display apparatus according to an exemplary embodiment of the present invention. For simplicity and convenience of description, illustration of the rear cover 30 is omitted from FIGS. 4(a) and 4(b).

The display module 10 is kept in a flat state, as shown in FIG. 4(a), under the condition that there is no force applied to the variable member 20.

The first portion 22 of the variable member 20 is fixed at the central region thereof by the fixing member 26a such that it cannot move. The first portion 22 is also disposed such that the central region of the first portion 22 is further protruded rearward from the display module 10, as compared to other regions of the first portion 22. In accordance with this structure, shape variation of the display module 10 can be more easily achieved. As described above, the guide members ("28" in FIG. 2) are disposed at opposite sides of the first portion 22, to support the first portion 22 while allowing the first portion 22 to be movable.

When the user inputs a command for shape variation, energy is supplied to the second portion 24 by the panel driver or the driver, which is a motor or the like, in order to reduce the connection length of the second portion 24. That is, electrical energy or thermal energy is supplied to reduce the connection length of the second portion 24 which is made of a shape memory alloy. Alternatively, mechanical energy is supplied to wind the second portion 24 on the rotating shaft and thereby, reducing the connection length of the second portion 24. Then, the first portion 22 is bent throughout the entirety thereof such that the opposite end regions thereof protrude forward and, as such, the shape of the display module 10 is also varied. As a result, the display module 10 is varied into a curved structure having a uniform radius of curvature R in the lateral direction of the display module 10, as shown in FIG. 4(b). Thus, the display module 10 provides an enhancement in sensory immersion of the user.

When the user inputs a command to again vary the shape of the display apparatus 100 back to its original shape, the connection length of the second portion 24 is increased to an original length, as shown in FIG. 4(a). Accordingly, the variable member 20 is returned to an original state thereof. Thus, in the illustrated embodiment, it is possible to vary the shape of the display module 10 in order to achieve an enhancement in sensory immersion of the user.

In this case, the distance between the first and second portions 22 and 24, the distance between the first portion 22 and the display module 10, and the distance between the second portion 24 and the display module 10 are variable at specific positions by the central fixing member 26a, end fixing member 26b, and interference-preventing fixing member 26c. Accordingly, increased force is applied, using less energy and, as such, shape variation of the display module 10 can be more effectively achieved.

For reference, the command to vary the shape of the display apparatus 100 may be inputted to the display apparatus 100 by various methods. For example, the user may input the command by pushing or pressing a button of the display apparatus, by using a remote control device (for example, a remote controller of the display apparatus 100), by vocal sound of the user, by body movement of the user (such as, moving eyes of the user or applauding), and etc.

Hereinafter, a display apparatus according to another exemplary embodiment of the present invention will be described with reference to FIGS. 5 to 7. With regard to the following embodiment, no description will be given of matters identical to those of the above-described embodiments, and only the different matters will be described in detail.

Figure 5:
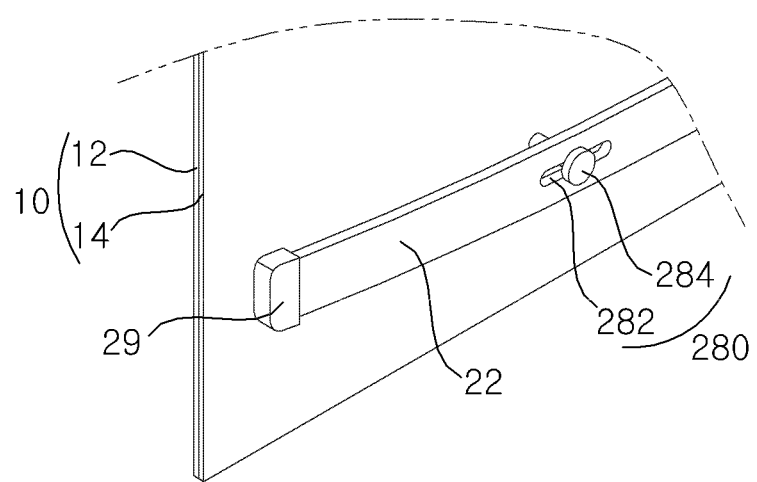
FIG. 5 is an exploded perspective view of a display apparatus according to another exemplary embodiment of the present invention.

FIG. 5 is an exploded perspective view of a display apparatus according to another exemplary embodiment of the present invention.

Referring to FIG. 5, in the illustrated embodiment, each of the guide members 280 includes a guide pin 284 fixed to the support member 14 such that it cannot move. The guide pin 284 extends through a slot 282 formed at the first portion 22 to extend in a longitudinal direction. In accordance with this structure, the guide member 280 supports the first portion 22 in a vertical direction (direction toward the display module 10) while allowing the first portion 22 to move in a lateral direction. Using various other structures and systems, the guide member 280 may support the first portion 22 while allowing the first portion 22 to be movable.

When the first portion 22 comes into contact with the support member 14 at the ends thereof, the support member 14 or the first portion 22 may be damaged or shape-changing may not be smoothly carried out. To this end, a protective member 29 may be fitted around each end of the first portion 22. Accordingly, it is possible to obtain enhanced structural stability and enhanced reliability.

Figure 6:
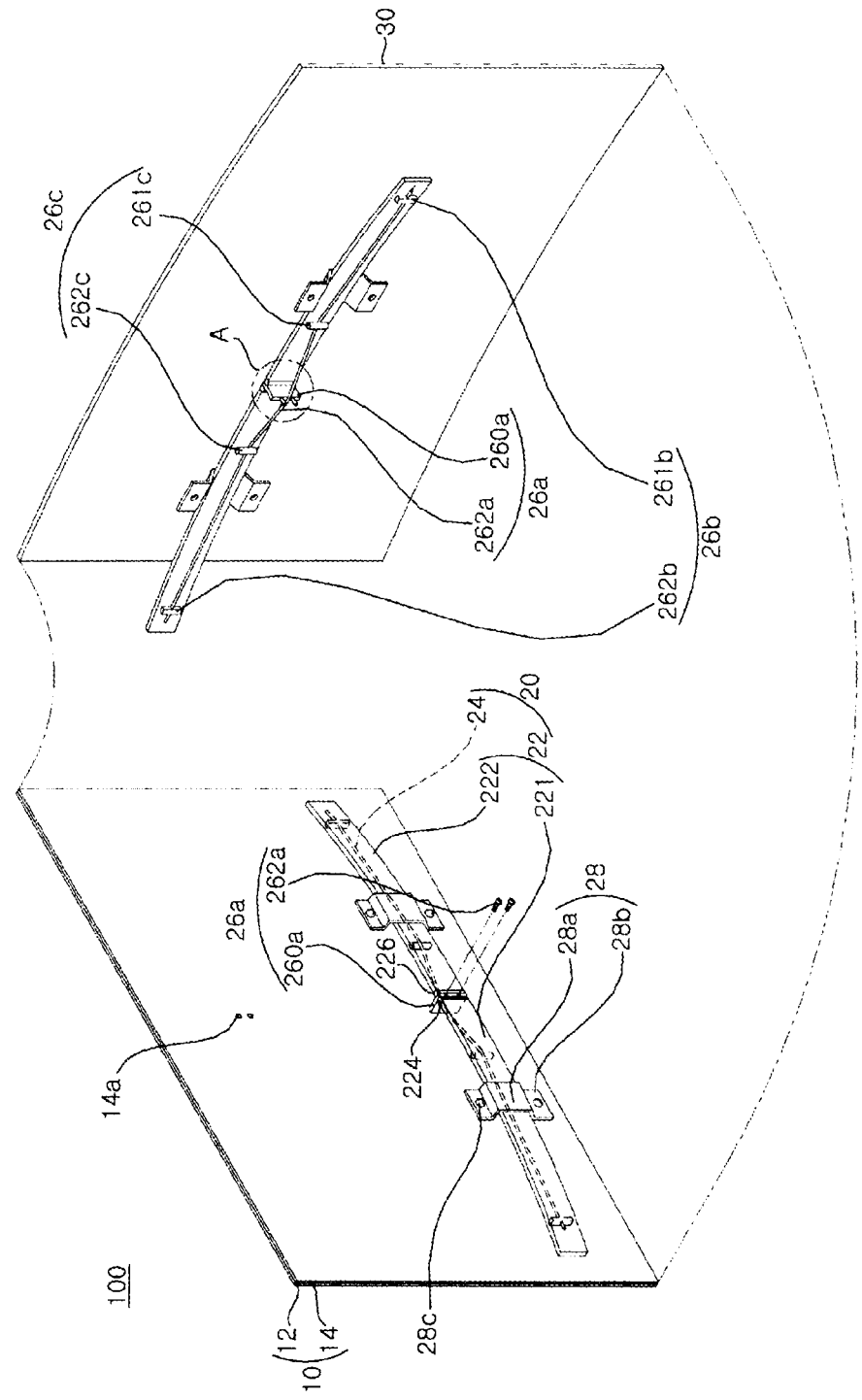
FIG. 6 is an exploded rear perspective view of the display apparatus according to an exemplary embodiment of the present invention.
Figure 7:
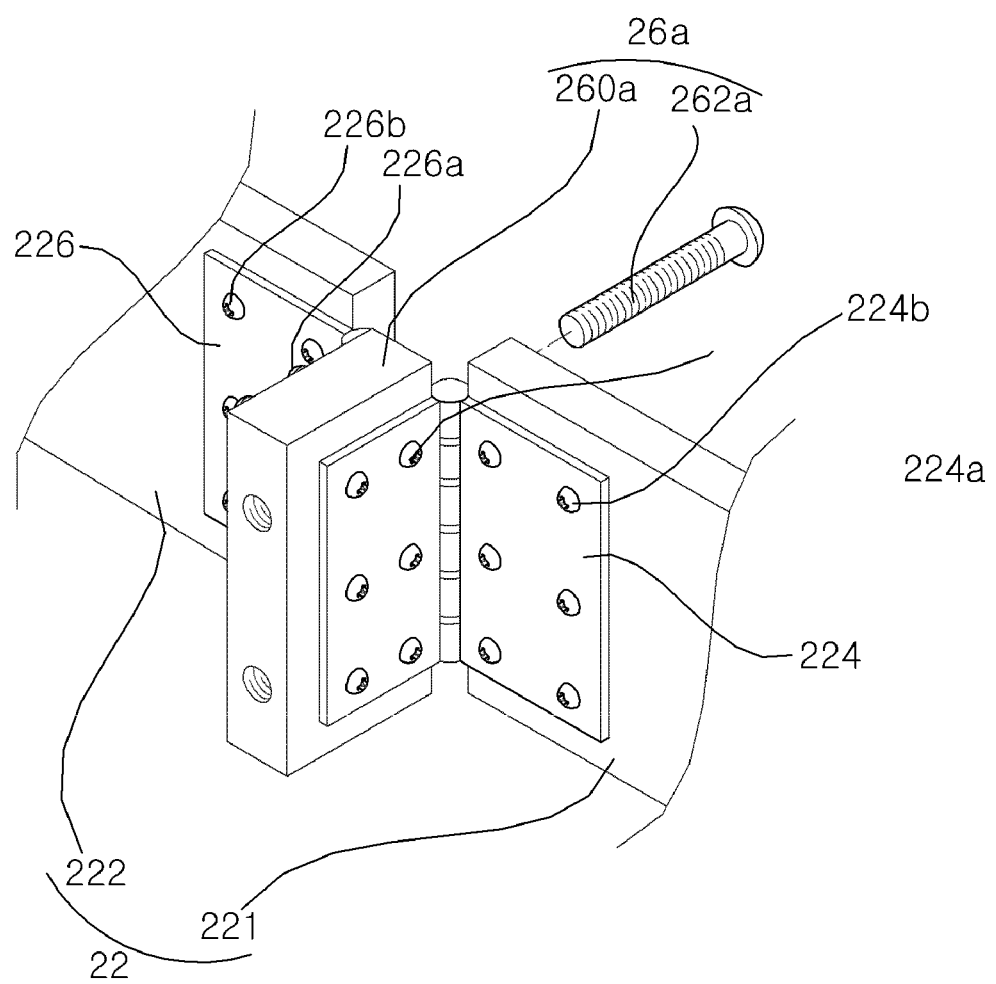
FIG. 7 is an expanded perspective view of an A portion of FIG. 6.

FIG. 6 is an exploded rear perspective view of the display apparatus according to an exemplary embodiment of the present invention, and FIG. 7 is an expanded perspective view of an A portion of FIG. 6.

According to the present embodiment, a first portion 22 comprises a first section 221 rotatably fixed to a central fixing member 26a to be positioned at one side of the central fixing member 26a and a second section 222 rotatably fixed to the central fixing member 26a to be positioned at the other side of the central fixing member 26a. For example, the first section 221 and the second section 222 may be spaced apart from each other while interposing the central fixing member 26a. Thereby, it is possible to prevent the first section 221 and the second section 222 from interfering with each other. A shape of the first portion 22 including the first and second sections 221 and 222 may be easily varied or changed. In this instance, the first and second sections 221 and 222 may be symmetrical each other with respect to the central fixing member 26a. Then, when the shape of the variable member 20 is varied, a force can be uniformly distributed, and thus, the first portion 22 is prevented from being distorted.

Specifically, the first section 221 is rotatable to one side of the central fixing member 26a by a first hinge member 224. In this instance, the first hinge member 224 comprises two plate members being rotatably coupled to each other. One plate member of the first hinge member 224 is fixed to one side surface of the central fixing member 26a by first coupling members 224a, and the other plate member is fixed to the first section 221 by second coupling members 224b.

The second section 222 is rotatable to the other side of the central fixing member 26a by a second hinge member 226. In this instance, the second hinge member 226 comprises two plate members being rotatably coupled to each other. One plate member of the second hinge member 226 is fixed to the other side surface of the central fixing member 26a by third coupling members 226a, the other plate member is fixed to the second section 222 by fourth coupling members 226b.

In this instance, the first and second sections 221 and 222 may be fixed to a rear portion of the central fixing member 26a. Then, a distance between inner ends of the first and second sections 221 and 222 and the support member 14 can be sufficiently secured.

In the present embodiment, the central fixing member 26a and the first and second sections 221 and 222 are connected by the first and second hinge members 224 and 226, respectively. Accordingly, the first and second sections 221 and 222 can be strongly fixed to the central fixing member 26a while the first and second sections 221 and 222 can be rotated. For example, at least one of the first and second hinge members 224 and 226 may include aluminum, steel, and so on. However, the embodiment is not limited thereto. Thus, various structures, types, and materials can be applied to the first and second hinge members 224 and 226.

The first to fourth coupling members 224a, 224b, 226a, and 226b may be fastening members such as bolts or screws. Therefore, the first and second sections 221 and 222 and the central fixing member 26a can be easily and simply fastened by using the first and second hinge members 224 and 226. However, the embodiment is not limited thereto. Thus, various structures, types, and materials can be applied to the first to fourth coupling members 224a, 224b, 226a, and 226b.

In the embodiment, the first portion 22 includes two sections (that is, the first and second sections 221 and 222), and the first and second sections 221 and 222 are fixed to the central fixing member 26a. However, the embodiment is not limited thereto. Therefore, it is possible that the first portion 22 includes three or more sections, and each section is fixed to the fixing member. Other various modifications are possible.

According to the embodiment, the plurality of sections 221 and 222 rotatably fixed to the central fixing member 26a can be easily rotated by small force. On the other hand, when the first portion 22 consists of one section, the shape of the first portion 22 is varied by changing a connection length of a second portion 24. In this instance, the first portion 22 is bent by the change of the connection length of the second portion 24. Thus, to change the shape of the first portion 22, relatively large force for bending the first portion 22 is necessary.

That is, in the present embodiment, since the first portion 22 includes the plurality of sections and the shape change of the first portion 22 are generated by rotating the plurality of sections, the force for changing the shape of the first portion 22 can be minimized. Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A display apparatus comprising:
a display module to display an image; and
a variable member to vary a shape of the display module, wherein the variable member comprises
a first portion capable of varying in shape, and
a second portion having opposite ends adjacent to opposite edges of the display module, whereby the opposite ends of the second portion are respectively fixed to opposite ends of the first portion; and the second portion is disposed between the first portion and the display module,
wherein a distance between the opposite ends of the second portion is varied such that the opposite ends of the first portion protrude with respect to a central region of the first portion and thereby, the display module is varied in shape.

2. The display apparatus according to claim 1, wherein a first distance between a central region of the first portion and a central region of the second portion and a second distance between each of the opposite ends of the first portion and a corresponding one of the opposite ends of the second portion are different.

3. The display apparatus according to claim 2, wherein the first distance is greater than the second distance.

4. The display apparatus according to claim 2, wherein the first distance is about 10 to 50 mm.

5. The display apparatus according to claim 3, wherein:
the variable member comprises
a central fixing member to fix the central region of the first portion to a central region of the display module;
a first end fixing member to fix one end of the first portion to one end of the second portion, and
a second end fixing member to fix the other end of the first portion to the other end of the second portion.

6. The display apparatus according to claim 5, wherein the variable member comprises at least one of:
a first interference-preventing fixing member to fix the second portion to the first portion in a region between the central fixing member and the first end fixing member, to prevent interference between the second portion and the display module; and
a second interference-preventing fixing member to fix the second portion to the first portion in a region between the central fixing member and the second end fixing member, to prevent interference between the second portion and the display module.

7. The display apparatus according to claim 6, wherein a distance between the first portion and the second portion is gradually reduced in a direction from the central fixing member to the first or second interference-preventing fixing member.

8. The display apparatus according to claim 1, wherein at least one of the first and second portions comprises a region where a distance from the at least one of the first and second portions to the display module is varied.

9. The display apparatus according to claim 8, wherein:
the second portion is disposed between the first portion and the display module; and
the second portion comprises a central district disposed in a central region of the second portion which is gradually spaced from a rear surface of the display module by a distance increasing gradually as the central section extends toward each end of the second portion, and a outer district disposed outside the central district which is gradually approaching the rear surface of the display module by a distance decreasing gradually as the outer section extends toward each end of the second portion.

10. The display apparatus according to claim 9, wherein the central district comprises a first central district spaced from the rear surface of the display module by a distance increasing gradually in a direction from the central region to one end of the second portion, and a second central district spaced from the rear surface of the display module by a distance increasing gradually in a direction from the central region to the other end of the second portion.

11. The display apparatus according to claim 10, wherein a length ratio of the first or second central district to a total length of the first portion is 0.1 to 0.2.

12. The display apparatus according to claim 10, wherein the first and second central districts are symmetrical with respect to each other.

13. The display apparatus according to claim 10, wherein:
the outer district comprises a first outer district disposed outside the first central district, and a second outer district disposed outside the second central district; and
the first and second outer districts are symmetrical with respect to each other.

14. The display apparatus according to claim 9, wherein, when an area between the first and second portions in the central district is a first area, and an area between the first and second portions in the outer district is a second area, a ratio of the first area to the second area is 16 to 400.

15. The display apparatus according to claim 9, wherein:
the second portion is disposed between the first portion and the display module;
the variable member comprises a central fixing member to fix the central region of the first portion to a central region of the display module such that a first distance is maintained between the central region of the first portion and the central region of the second portion;

a first end fixing member to fix one end of the first portion to one end of the second portion such that a second distance smaller than the first distance is maintained between one end of the first portion and one end of the second portion;

a second end fixing member to fix the other end of the first portion to the other end of the second portion such that the second distance is maintained between the other end of the first portion and the other end of the second portion;

a first interference-preventing fixing member to fix the second portion to the first portion in a region between the central fixing member and the first end fixing member, to prevent interference between the second portion and the display module; and a second interference-preventing fixing member to fix the second portion to the first portion in a region between the central fixing member and the second end fixing member, to prevent interference between the second portion and the display module;

the central district comprises a district between the first interference-preventing fixing member and the central fixing member and a district between the central fixing member and the second interference-preventing fixing member; and the outer district comprises a district between the first interference-preventing fixing member and the first end fixing member and a district between the second interference-preventing fixing member and the second end fixing member.

16. The display apparatus according to claim 8, wherein the first portion is further protruded from a rear surface of the display apparatus at the central region of the first portion than at the ends of the first portion.

17. The display apparatus according to claim 1, wherein the opposite ends of the first portion are spaced from corresponding lateral edges of the display module by a distance of 1 to 30 mm.

18. The display apparatus according to claim 1, further comprising:
    guide members fixed to the display module, to support the first portion at opposite sides of the first portion while allowing the first portion to be movable within the guide members.

19. The display apparatus according to claim 18, wherein a ratio of each of the guide members spaced from a corresponding one of the ends of the first portion to a total length of the first portion is 0.2 to 0.4.

20. The display apparatus according to claim 1, wherein:
    the first portion comprises a plurality of sections,
    the variable member comprises a fixing member to fix the first portion to the display module,
    the plurality of sections comprises a first section rotatably fixed to the fixing member to be positioned at one side of the fixing member and a second section rotatably fixed to the fixing member to be positioned at the other side of the fixing member.

* * * * *